(12) United States Patent
Zhou (10) Patent No.: US 10,916,296 B2
(45) Date of Patent: Feb. 9, 2021

(54) SEMICONDUCTOR STRUCTURE AND MANUFACTURING METHOD THEREOF

(71) Applicant: Shanghai Huali Integrated Circuit Mfg. Co., Ltd., Shanghai (CN)

(72) Inventor: Xiaojun Zhou, Shanghai (CN)

(*) Notice: Subject to any disclaimer, the term of this patent is extended or adjusted under 35 U.S.C. 154(b) by 0 days.

(21) Appl. No.: 16/684,564

(22) Filed: Nov. 14, 2019

(65) Prior Publication Data

US 2020/0211637 A1 Jul. 2, 2020

(30) Foreign Application Priority Data

Dec. 29, 2018 (CN) .......................... 2018 1 1637818

(51) Int. Cl.
| | |
|---|---|
| *G11C 11/00* | (2006.01) |
| *G11C 11/412* | (2006.01) |
| *H01L 27/11* | (2006.01) |
| *G11C 11/419* | (2006.01) |

(52) U.S. Cl.
CPC .......... *G11C 11/412* (2013.01); *G11C 11/419* (2013.01); *H01L 27/1104* (2013.01)

(58) Field of Classification Search
CPC .................................................. G11C 11/412
USPC .......................................................... 365/154
See application file for complete search history.

(56) References Cited

U.S. PATENT DOCUMENTS

| | | | | |
|---|---|---|---|---|
| 2011/0026289 | A1* | 2/2011 | Liaw ..................... | G11C 11/412 365/51 |
| 2012/0086082 | A1* | 4/2012 | Malinge ................ | G11C 11/412 257/368 |
| 2015/0009750 | A1* | 1/2015 | Schaefer ................ | H01L 27/11 365/156 |

* cited by examiner

*Primary Examiner* — Hoai V Ho
(74) *Attorney, Agent, or Firm* — Kilpatrick Townsend & Stockton, LLP (57) ABSTRACT

The present disclosure provides a semiconductor structure and a method of fabricating the same, the semiconductor structure being a dual port static random access memory cell, the memory cell comprising a plurality of transistors, the plurality of transistors including a first pull-down transistor and a second pull-down transistor, the first pull-down transistor includes a plurality of first pull-down sub-transistors connected in parallel, the second pull-down transistor includes a plurality of second pull-down sub-transistors connected in parallel, plurality of gates of the plurality of first pull-down sub-transistors are parallel to each other, plurality of gates of the plurality of second pull-down sub-transistors are parallel to each other.

20 Claims, 8 Drawing Sheets

SEMICONDUCTOR STRUCTURE AND MANUFACTURING METHOD THEREOF

CROSS-REFERENCES TO RELATED APPLICATIONS

The present application claims priority to Chinese Patent Application No. 201811637818.9, filed on Dec. 29, 2018, entitled "SEMICONDUCTOR STRUCTURE AND MANUFACTURING METHOD THEREOF", which is incorporated by reference herein for all purposes.

FIELD

The present disclosure relates to the field of semiconductor structures and methods of fabricating the same, and more particularly to a structure of a dual port static random access memory and a method of fabricating the same.

BACKGROUND

Since the disclosure of integrated circuits by Dr. Jack Kilby of Texas Instruments in early years, scientists and engineers have made numerous disclosures and improvements in semiconductor devices and processes. Over 50 years, the dimensions of semiconductors have been significantly reduced, which translates into an increasing processing speed and decreasing power consumption. To date, the development of semiconductors has largely followed Moore's Law, which roughly states that the number of transistors in dense integrated circuits doubles about every two years. At present, semiconductor processes are developing toward below 20 nm, and some companies are embarking on 14 nm processes. Just to provide a reference herein, a silicon atom is about 0.2 nm, which means that the distance between two separate components manufactured by a 20 nm process is about only one hundred silicon atoms. Semiconductor device manufacturing has therefore become increasingly challenging and advancing toward the physically possible limit.

Static Random Access Memory (SRAM) is commonly used in integrated circuits (referred as IC). A feature of SRAM devices is that stored data is not refreshed. A typical SRAM cell includes two pass-gate transistors through which data bits can be read from or written to the SRAM cell. This type of SRAM cell is a single port SRAM cell. Another type of SRAM cell is a dual port SRAM cell, and each SRAM cell has four pass gate transistors. Since dual port SRAM devices allow parallel operation, such as 1R (read) 1W (write) or 2R (read) in one cycle, their bandwidth is higher than that of single-port SRAM.

Figure 1:
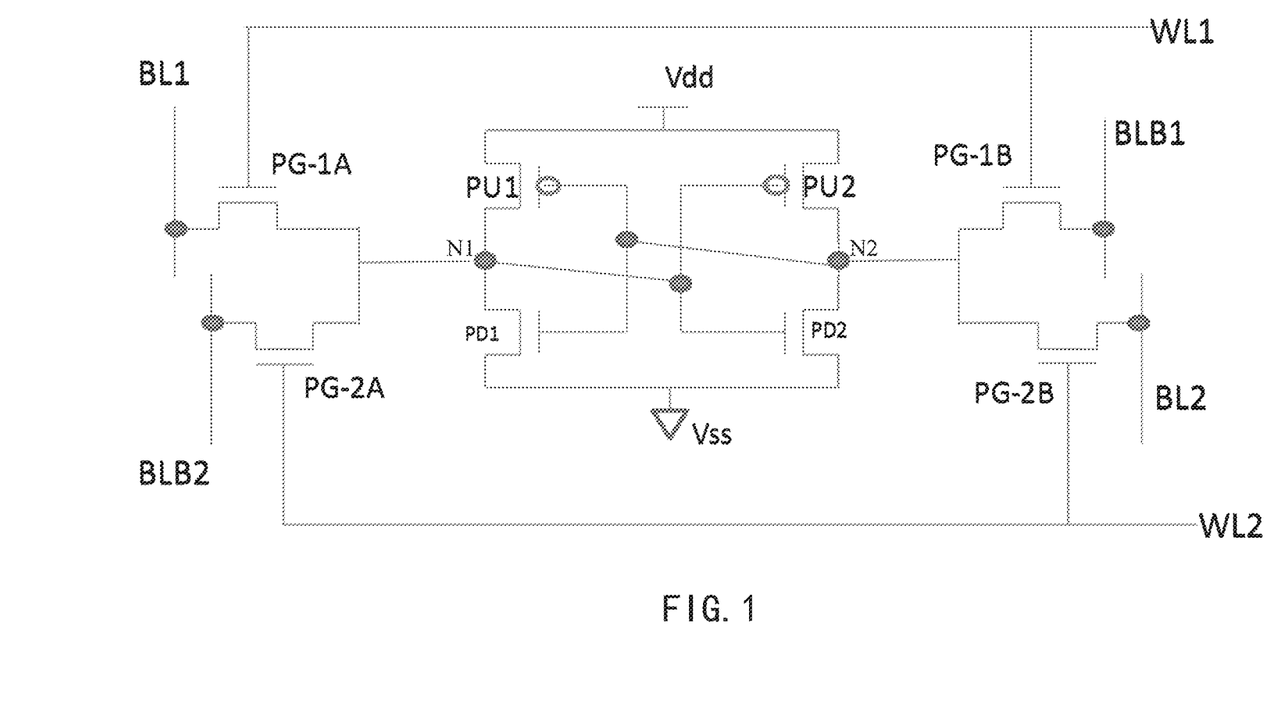
FIG. 1 is a schematic diagram showing the circuit structure of a double-port SRAM cell provided by the present disclosure.

Please refer to FIG. 1. FIG. 1 is a schematic diagram showing the circuit structure of a dual port SRAM unit. Specifically, the dual port SRAM cell with eight transistors shown in FIG. 1 has pull-up transistors PU1 and PU2 and pull-down transistors PD1 and PD2. The pass gate transistors PG-1A and PG-1B form a first connection port of the dual port SRAM cell, and the pass gate transistors PG-2A and PG-2B form a second connection port of the dual port SRAM cell. The gates of the pass gate transistors PG-1A and PG-1B are controlled by the word line WL1, and the gates of the transfer gate transistors PG-2A and PG-2B are controlled by the word line WL2. Latch is formed to storage bit data by pull-up transistors PU1 and PU2 and pull-down transistors PD1 and PD2. With the bit lines BL1 and BLB1, the stored bits can be read via the first connection port, or the stored bits can be read via the second connection port using the bit lines BL2 and BLB2. Conversely, bit data can be written to the SRAM cell via the first connection port or the second connection port.

In order to support parallel operation (where two connection ports may be in the "On" state at the same time), the pull-down transistors PD1 and PD2 respectively carry the drive currents from the pass gate transistors PG-1A to PG-2A. In order to make the current flowing through PD1 and PD2 evenly dispersed, PD1 can be set as two pull-down transistors PD1-1 and PD1-2 connecting to each other, and PD2 is set as PD2-1 and PD2-2 (refer to FIG. 2). If desired, three or more pull-down transistors can be connected to act as a single pull-down transistor, which will allow the current to be more evenly dispersed.

Figure 3:
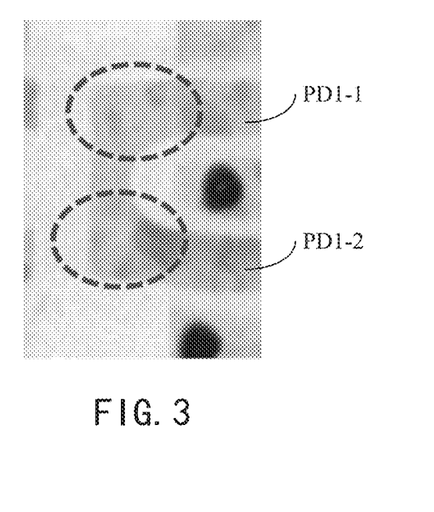
FIG. 3 shows an SEM image of a dual-port SRAM cell fabricated in a prior art process.

Those skilled in the art need to consider connecting the gates of PD1-1 and PD1-2 to each other and connecting the gates of PD2-1 and PD2-2 to each other when designing the layout of the above-mentioned double-port SRAM cell. In the prior art, when the gates of the plurality of transistors of the double-port SRAM cell are formed, the connection of gates of PD1-1 and PD1-2 and the connection of gates of PD2-1 and PD2-2 are formed directly by patterning. FIG. 3 shows a schematic view of the above connection. Since optical interference diffraction in lithography, micro-loading of the etch process and other process variables results in corner rounding (effective gate fat at the corners, as shown in the dashed box shown in FIG. 3), that is, makes Leff larger.

The above manufacturing process does not have a big problem when the process feature size is relatively large, and is the most straightforward and simple method. However, as mentioned above, as the feature size shrinks, the Leff change caused by the above process occupies more and more weight. Due to the uncertainty of the process, the Leff of the transistor is uncertain, accompanied by the randomness of the left and right asymmetry of the layout, the performance of the double-port SRAM cell is deteriorated, which affects the device matching in the SRAM Cell, to affect the product yield.

In view of this, it is needed to design a new device layout to improve corner rounding problems of the above-mentioned, to improve electrical matching of the device, and increasing the process window.

SUMMARY

A brief summary on one or more aspects is given below to provide the basic understanding for these aspects. This summary is not an exhaustive overview of all the contemplated aspects and is neither intended to indicate critical or decisive elements of all aspects nor to attempt to define the scope of any or all aspects. Its sole purpose is to present some concepts of one or more aspects in a simplified form as a preface for a more detailed description presented later.

In order to improve the above corner rounding problem, to improve the electrical matching of the device and increase the process window, the present disclosure provides a semiconductor structure of a dual port static random access memory cell, the dual port static random access memory cell comprising a plurality of transistors, the plurality of transistors comprising a first pull-down transistor and a second pull-down transistor, and, the first pull-down transistor includes a plurality of first pull-down sub-transistors connected in parallel, the plurality of first pull-down sub-transistors sharing a first pull-down transistor active area extending in a first direction, the second pull-down transistor includes a plurality of second pull-down sub-transistors connected in parallel, the plurality of second pull-down sub-transistors sharing a second pull-down transistor active area extending in the first direction; the plurality of gates of the plurality of first pull-down sub-transistors are parallel to each other and extend in a second direction, and the plurality of gates of the plurality of second pull-down sub-transistors are parallel to each other and extend in the second direction, the second direction being perpendicular to the first direction; the semiconductor structure further includes a first gate connector and a second gate connector, the first gate connector shorting the plurality of gates of the plurality of first pull-down sub-transistors, the second gate connector shorting the plurality of gates of the plurality of second pull-down sub-transistors; and a first connection layer where the first gate connector and the second gate connector are located and a gate layer where the plurality of gates of the plurality of first pull-down sub-transistors and the plurality of gates of the plurality of second pull-down sub-transistors are located are located on different planes.

In the above embodiments, the first connection layer is above the gate layer; the first gate connector includes a first gate metal line, the plurality of gates of the plurality of first pull-down sub-transistors and the first gate metal line are connected by a plurality of first gate contactors extending along a height of the semiconductor structure; and the second gate connector includes a second gate metal line, the plurality of gates of the plurality of second pull-down sub-transistors and the second gate metal line are connected by a plurality of second gate contactors extending along a height of the semiconductor structure.

In the above embodiments, the plurality of transistors further comprises a first pull-up transistor, a second pull-up transistor, a first set of pass-gate transistor, and a second set of pass-gate transistor, and the first pull-up transistor includes a first pull-up transistor active area and a first pull-up transistor gate, and the second pull-up transistor includes a second pull-up transistor active area and a second pull-up transistor gate, the first pull-up transistor active area and the second pull-up transistor active area are parallel to each other and extend along the first direction; the first set of pass-gate transistor includes a first port gate transistor and a second port gate transistor, the first port gate transistor and the second port gate transistor share a first gate transistor active area extending along the first direction; the second set of pass-gate transistor includes a third port gate transistor and a fourth port gate transistor, the third port gate transistor and the fourth port gate transistor share a second gate transistor active area extending along the first direction; the semiconductor structure further includes a first node connector and a second node connector, and the first node connector shorts sources of the first set of pass-gate transistor located in the first gate transistor active area, a drain of the first pull-up transistor located in the first pull-up transistor active area and a plurality of drains of the plurality of first pull-down sub-transistors located in the first pull-down transistor active area; the second node connector shorts sources of the second set of pass-gate transistor located in the second gate transistor active area, a drain of the second pull-up transistor located in the second pull-up transistor active area and a plurality of drains of the plurality of second pull-down sub-transistors located in the second pull-down transistor active area; and the first node connector and the second node connector are located at a second connection layer, and the first connection layer and the second connection layer are located on different planes.

In the above embodiments, the first gate connector comprises a first gate metal line extending along the first direction, the second gate connector comprises a second gate metal line extending along the second direction; and the first node connector includes a first node metal line extending along the second direction, and the second node connector includes a second node metal line extending along the second direction.

In the above embodiments, the first connection layer locates between the gate layer and the second connection layer; the first gate metal line is connected to the plurality of gates of the plurality of first pull-down sub-transistors through a plurality of first gate contacts, the second gate metal line is connected to the plurality of gates of the plurality of second pull-down sub-transistors through a plurality of second gate contacts; the first node metal line and the sources of the first set of pass-gate transistor, the drain of the first pull-up transistor and the plurality of drains of the plurality of first pull-down sub-transistors are connected by a plurality of first node contactors passing through the first connection layer, the second node metal line and the sources of the second set of pass-gate transistor, the drain of the second pull-up transistor and the plurality of drains of the plurality of second pull-down sub-transistors are connected by a plurality of second node contactors passing through the first connection layer.

In the above embodiments, the plurality of first node contactors further comprise a plurality of first drain contacts located in the first connection layer, first source contacts, and a first drain metal line connecting the plurality of first drain contacts, the plurality of second node contactors further comprise a plurality of second drain contacts, second source contacts, and a second drain metal line connecting the plurality of second drain contacts, and the plurality of first drain contacts lead out a plurality of drains of the plurality of first pull-down sub-transistors and drain of the first pull-up transistor, the first source contacts lead out sources of the first set of pass-gate transistor, the plurality of second drain contacts lead out a plurality of drains of the plurality of second pull-down sub-transistors and drain of the second pull-up transistor, the second source contacts lead out sources of the second set of pass-gate transistor; and the plurality of first node contactors further comprise first node vias, the plurality of second node contactors further comprise second node vias, and the first node metal line is connected to the first drain metal line and the first source contacts through the first node vias, the second node metal line is connected to the second drain metal line and the second source contacts through the second node vias.

In the above embodiments, the second connection layer locates between the gate layer and the first connection layer; the first node metal line is connected to sources of the first set of pass-gate transistor, drain of the first pull-up transistor and a plurality of drains of the plurality of first pull-down sub-transistors by a plurality of first node contacts, the second node metal line is connected to sources of the second set of pass-gate transistor, drain of the second pull-up transistor and a plurality of drains of the plurality of second pull-down sub-transistors by a plurality of second node contacts; and the first gate metal line is connected to a plurality of gates of the plurality of first pull-down sub-transistors by a plurality of first gate contactors passing through the second connection layer, the second gate metal line is connected to a plurality of gates of the plurality of second pull-down sub-transistors by a plurality of second gate contactors passing through the second connection layer.

In the above embodiments, the plurality of first gate contactors further comprises a first contact portion in the second connection layer and a first via portion connecting the first contact portion and the first gate metal line, the plurality of second gate contactors further comprises a second contact portion in the second connection layer and a second via portion connecting the second contact portion and the second gate metal line.

In the above embodiments, gate of the first pull-up transistor extends from one of the plurality of gates of the plurality of first pull-down sub-transistors and extends to the drain of the second pull-up transistor, and electrically connected to the second node connector by drain of the second pull-up transistor; and gate of the second pull-up transistor extends from one of the plurality of gates of the plurality of second pull-down sub-transistors and extends to drain of the first pull-up transistor, and electrically connected to the first node connector by drain of the first pull-up transistor.

In the above embodiments, the layout of the dual port static random access memory cell is a central symmetrical pattern in the height direction of the semiconductor structure.

The present disclosure also provides a manufacturing method of semiconductor structure, the semiconductor structure being a dual port static random access memory cell, the dual port static random access memory cell comprising a plurality of transistors, the plurality of transistors comprising a first pull-down transistor and a second pull-down transistor, the first pull-down transistor includes a plurality of first pull-down sub-transistors connected in parallel, and the second pull-down transistor includes a plurality of second pull-down sub-transistors connected in parallel, the manufacturing method includes: providing a substrate in which an active area of the plurality of transistors extending in a first direction is formed, and the plurality of first pull-down sub-transistors share a first pull-down transistor active area, the plurality of second pull-down sub-transistors share a second pull-down transistor active area; forming gates of the plurality of transistors extending in a second direction over an active area of the plurality of transistors, the second direction being perpendicular to the first direction, and a plurality of gates of the plurality of first pull-down sub-transistors are parallel and electrically isolated from each other, a plurality of gates of the plurality of second pull-down sub-transistors are parallel and electrically isolated from each other; and forming a first gate connector shorting the plurality of gates of the plurality of first pull-down sub-transistors in a first connection layer above the plurality of gates of the plurality of first pull-down sub-transistors, forming a second gate connector shorting the plurality of gates of the plurality of second pull-down sub-transistors in the first connection layer.

In the above embodiments, forming the first gate connection and the second gate connection further comprises: forming a plurality of first gate contacts over the plurality of gates of the plurality of first pull-down sub-transistors, forming a plurality of second gate contacts over the plurality of gates of the plurality of second pull-down sub-transistors; and forming a first gate metal line connecting the plurality of first gate contacts over the plurality of first gate contacts, forming a second gate metal line connecting the plurality of second gate contacts over the plurality of second gate contacts.

In the above embodiments, the plurality of transistors further comprises a first pull-up transistor, a second pull-up transistor, a first set of pass-gate transistor, and a second set of pass-gate transistor, and the first pull-up transistor includes a first pull-up transistor active area and a first pull-up transistor gate, and the second pull-up transistor includes a second pull-up transistor active area and a second pull-up transistor gate, the first pull-up transistor active area and the second pull-up transistor active area are parallel to each other and extend along the first direction; the first set of pass-gate transistor includes a first port gate transistor and a second port gate transistor, the first port gate transistor and the second port gate transistor share a first gate transistor active area extending along the first direction; the second set of pass-gate transistor includes a third port gate transistor and a fourth port gate transistor, the third port gate transistor and the fourth port gate transistor share a second gate transistor active area extending along the first direction; the manufacturing method further includes forming a first node connector and a second node connector in the second connection layer, and the first connection layer and the second connection layer are located on different planes; and the first node connector shorts sources of the first set of pass-gate transistor located in the first gate transistor active area, a drain of the first pull-up transistor located in the first pull-up transistor active area and a plurality of drains of the plurality of first pull-down sub-transistors located in the first pull-down transistor active area; the second node connector shorts sources of the second set of pass-gate transistor located in the second gate transistor active area, a drain of the second pull-up transistor located in the second pull-up transistor active area and a plurality of drains of the plurality of second pull-down sub-transistors located in the second pull-down transistor active area.

In the above embodiments, the forming the first gate connector further comprises forming a first gate metal line extending along the first direction, forming the second gate connector further comprises forming a second gate metal line extending along the second direction; and forming the first node connector further comprises forming a first node metal line extending along the second direction, forming the second node connector further comprises forming a second node metal line extending along the second direction.

In the above embodiments, the first connection layer is formed between the gate layer and the second connection layer; the manufacturing method further includes forming a plurality of first gate contacts and a plurality of second gate contacts, and the first gate metal line is connected to the plurality of gates of the plurality of first pull-down sub-transistors by the plurality of first gate contacts, the second gate metal line is connected to the plurality of gates of the plurality of second pull-down sub-transistors by the plurality of second gate contacts; and the manufacturing method further includes forming a plurality of first node contactors and a plurality of second node contactors passing through the first connection layer, and the first node metal line and the sources of the first set of pass-gate transistor, the drain of the first pull-up transistor and the plurality of drains of the plurality of first pull-down sub-transistors are connected by the plurality of first node contactors, the second node metal line and the sources of the second set of pass-gate transistor, drain of the second pull-up transistor and the plurality of drains of the plurality of second pull-down sub-transistors are connected by the plurality of second node contactors.

In the above embodiments, the forming the plurality of first node contactors further comprises: forming a plurality of first drain contacts, first source contacts, and a first drain metal line connecting the plurality of first drain contacts in the first connection layer; forming the plurality of second node contactors further comprises: forming a plurality of second drain contacts, second source contacts, and a second drain metal line connecting the plurality of second drain contacts in the second connection layer, and the plurality of first drain contacts lead out a plurality of drains of the plurality of first pull-down sub-transistors and drain of the first pull-up transistor, the first source contacts lead out sources of the first set of pass-gate transistor, the plurality of second drain contacts lead out a plurality of drains of the plurality of second pull-down sub-transistors and drain of the second pull-up transistor, the second source contacts lead out sources of the second set of pass-gate transistor; and forming the plurality of first node contactors further comprises: forming first node vias, forming the plurality of second node contactors further comprises: forming second node vias, and the first node metal line is connected to the first drain metal line and the first source contacts through the first node vias, the second node metal line is connected to the second drain metal line and the second source contacts through the second node vias.

In the above embodiments, the second connection layer is formed between the gate layer and the first connection layer; the manufacturing method further includes forming a plurality of first node contacts and a plurality of second node contacts, and the first node metal line is connected to sources of the first set of pass-gate transistor, drain of the first pull-up transistor and a plurality of drains of the plurality of first pull-down sub-transistors by the plurality of first node contacts, the second node metal line is connected to sources of the second set of pass-gate transistor, drain of the second pull-up transistor and a plurality of drains of the plurality of second pull-down sub-transistors by the plurality of second node contacts; and the manufacturing method further includes forming a plurality of first gate contactors and a plurality of second gate contactors passing through the second connection layer, and the first gate metal line is connected to a plurality of gates of the plurality of first pull-down sub-transistors by the plurality of first gate contactors, the second gate metal line is connected to a plurality of gates of the plurality of second pull-down sub-transistors by the plurality of second gate contactors.

In the above embodiments, forming the plurality of first gate contactors further comprises: forming a first contact portion in the second connection layer and forming a first via portion connecting the first contact portion and the first gate metal line; and forming the plurality of second gate contactors further comprises: forming a second contact portion in the second connection layer and forming a second via portion connecting the second contact portion and the second gate metal line In the above embodiments, the forming the gates of the plurality of transistors extending along the second direction further comprises: forming the gate of the first pull-up transistor which extends from one of the plurality of gates of the plurality of first pull-down sub-transistors and extends to drain of the second pull-up transistor, the gate of the first pull-up transistor is electrically connected to the second node connector by drain of the second pull-up transistor; and forming the gate of the second pull-up transistor which extends from one of a plurality of gates of the plurality of second pull-down sub-transistors and extends to drain of the first pull-up transistor, the gate of the second pull-up transistor is electrically connected to the first node connector by drain of the first pull-up transistor.

In the above embodiments, the layout of the formed dual port static random access memory cell is a central symmetrical pattern in the height direction of the semiconductor structure.

The double-ended SRAM cell fabricated according to the manufacturing method provided by the present disclosure can effectively improve the electrical matching between devices and increase the process window. Moreover, the manufacturing method provided by the present disclosure is compatible with the conventional process without incurring additional manufacturing costs.

DETAILED DESCRIPTION

The following description is presented to enable one of ordinary skill in the art to implement and use the present disclosure and incorporate it into the context of a particular application. Various modifications, as well as various usages in various applications, will be readily apparent to those skilled in the art, and the generic principles defined herein may be applicable to a wide range of embodiments. Thus, the present disclosure is not limited to the embodiments presented herein, but rather should be given its broadest scope consistent with the principles and novel features disclosed herein.

In the following detailed description, numerous specific details are set forth to provide a more thorough understanding of the present disclosure. However, it will be apparent to those skilled in the art that the present disclosure may be practiced without limitations from these specific details. In other words, well-known structures and devices are shown in a block diagram form and are not shown in detail, to avoid obscuring the present disclosure.

The reader is cautioned as to all files and documents which are filed at the same time as this specification and which are open for the public to consult, and the contents of all such files and documents are incorporated herein by reference. Unless directly stated otherwise, all features disclosed in this specification (including any of the appended claims, the abstract, and the accompanying drawings) may be replaced by alternative features serving the same, equivalent, or similar purposes. Therefore, unless expressly stated otherwise, each of the features disclosed is only one example of a group of equivalent or similar features.

Note that when used, the flags left, right, front, back, top, bottom, front, back, clockwise, and counter-clockwise are used for convenience purposes only and do not imply any specific fixed direction. In fact, they are used to reflect the relative position and/or direction between various parts of an object.

As used herein, the terms "over . . . ", "under . . . ", "between . . . and . . . ", and "on . . . " means the relative position of that layer relative to another layer. Likewise, for example, a layer that is deposited or placed over or under another layer may be in direct contact with another layer or there may be one or more intervening layers. In addition, a layer that is deposited or placed between layers may be in direct contact with the layers or there may be one or more intervening layers. In contrast, a first layer "on" a second layer is in contact with the second layer. In addition, a relative position of a layer relative to another layer is provided (assuming that film operations of deposition, modification, and removal are performed in relative to a starting substrate, without considering the absolute orientation of the substrate).

Figure 4:
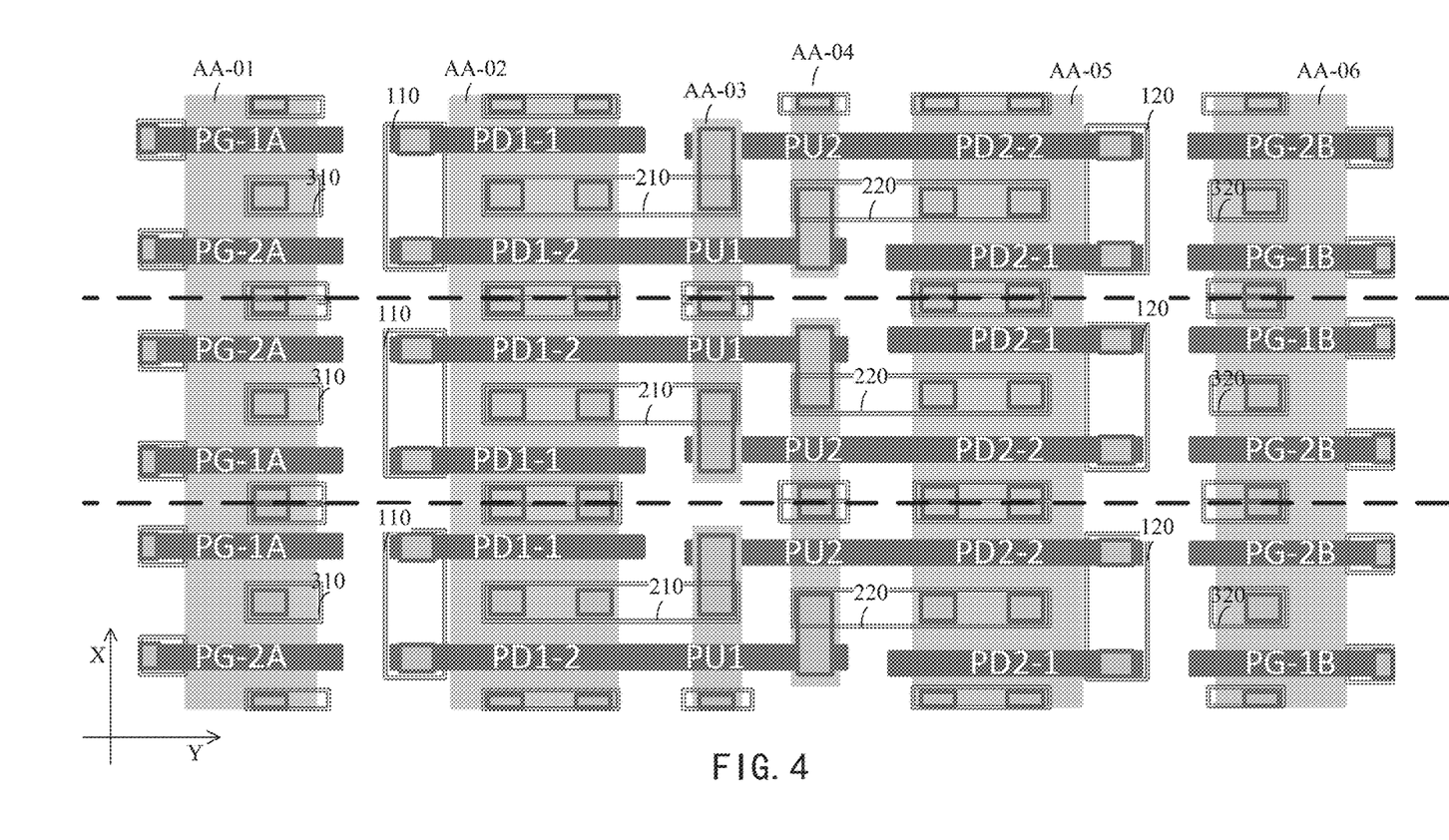
FIG. 4 shows a schematic diagram of the embodiment of a dual-port SRAM cell layout provided by the present disclosure.

As described above, in order to improve the electrical matching between devices, and improve corner rounding of the gate connection portion, the present disclosure provides a novel design of a dual-port SRAM cell layout, referring to FIG. 4. FIG. 4 shows a schematic diagram of a dual-port SRAM cell layout design according to an embodiment of the present disclosure corresponding to the circuit structure shown in FIG. 2. FIG. 4 shows three double-port SRAM cells, and those skilled in the art will appreciate that more dual-port SRAM cells can be designed in accordance with the example of FIG. 4. Each of the double-port SRAM cells includes eight transistors, including specifically a first set of pass gate transistors (including a first pass gate transistor PG-1A, a second pass gate transistor PG-2A), a plurality of first pull-down sub-transistors (the two first pull-down sub-transistors shown as PD1-1 and PD1-2 in the figure), a first pull-up transistor PU1, a second pull-up transistor PU2, a plurality of second pull-down sub-transistors (the two second pull-down sub-transistors shown as PD2-1 and PD2-2 in the figure) and a second set of pass gate transistors (including a third pass gate transistor PG-1B, a fourth pass gate transistor PG2B).

The first set of pass gate transistors of a plurality of dual-port SRAM cells share a first gate transistor active area AA-01, a plurality of first pull-down sub-transistors share a first pull-down transistor active area AA-02, a plurality of first pull-up transistors share a first pull-up transistor active region AA-03, a plurality of second pull-up transistors share a second pull-up transistor active region AA-04, a plurality of second pull-down sub-transistors share a second pull-down transistor active area AA-05, and the second set of pass gate transistors of the plurality of dual-port SRAM cells share a second gate transistor active area AA-06. All the first gate transistor active area AA-01, the first pull-down transistor active area AA-02, the first pull-up transistor active region AA-03, the second pull-up transistor active region AA-04, the second pull-down transistor active area AA-05 and the second gate transistor active area AA-06 extend in the X direction.

It should be understood by those skilled in the art that each of the above active areas can be formed in a semiconductor substrate by existing or future techniques, and one active area and another active area may be separated by an isolation medium such as shallow trench isolation (STI).

Multiple gates of a plurality of transistors of a plurality of dual-port SRAM cells extend along the Y direction, and gates of PG-1A, PD1-1, PU2, PD2-2, and PG-2B are extending along a same gate line, gates of PG-2A, PD1-2, PU1, PD2-1, and PG-1B are extending along a same gate line.

The plurality of gates of the plurality of transistors described above may be formed on the substrate by existing or future techniques, such as by patterning and then depositing polysilicon. The gates of a plurality of devices in the same gate line may be spaced apart. The plurality of gate lines are parallel to each other, and the plurality of gate lines may be spaced apart by isolation medium such as shallow trench isolation (STI).

In the layout design of the present disclosure, there's no connecting portion between the gates of PD1-1 and PD1-2 and between the gates of PD2-1 and PD2-2 after forming the said gate. It is possible to avoid corner rounding caused by the connection of the gates of PD1-1 and PD1-2, and the connection of the gates of PD2-1 and PD2-2 in the prior art. Also, since it is not necessary to form the connection portion in the step of forming the gate, the step of forming the gate can be greatly simplified.

In order to short the gates of the PD1-1 and PD1-2, and short the gates of the PD2-1 and the PD2-2 respectively, in the embodiment shown in FIG. 4, the first gate connector 110 and the second gate connector 120 are formed to short the gates of the PD1-1 and PD1-2, and the gates of PD2-1 and PD2-2. The first gate connector 110 and the second gate connector 120 are formed on the rear metal layer M1 of the semiconductor device, and the rear metal layer M1 and the gate layer where the gates are located are located on different planes. From the height direction of the semiconductor device, the rear metal layer M1 is generally located above the gate layer.

The first gate connector 110 formed in the metal layer M1 includes contacts (CT, a rectangular frame located on the gate in the figure) that lead out the gate of PD1-1 and the gate of PD1-2, and a metal line (the thin line rectangle in the figure) extending along the X direction to connect the above contacts. Correspondingly, the second gate connector 120 includes contacts (CT, a rectangular frame located on the gate in the figure) that lead out the gate of PD2-1 and the gate of PD2-2, and a metal line (the thin line rectangle in the figure) extending along the X direction to connect the above contacts.

Those skilled in the art will appreciate that the above-described method of forming contacts and connecting metal lines in the rear metal layer M1 can be achieved by existing or future techniques, and the above techniques are highly compatible with existing processes. It does not increase the manufacturing process cost.

Figure 2:
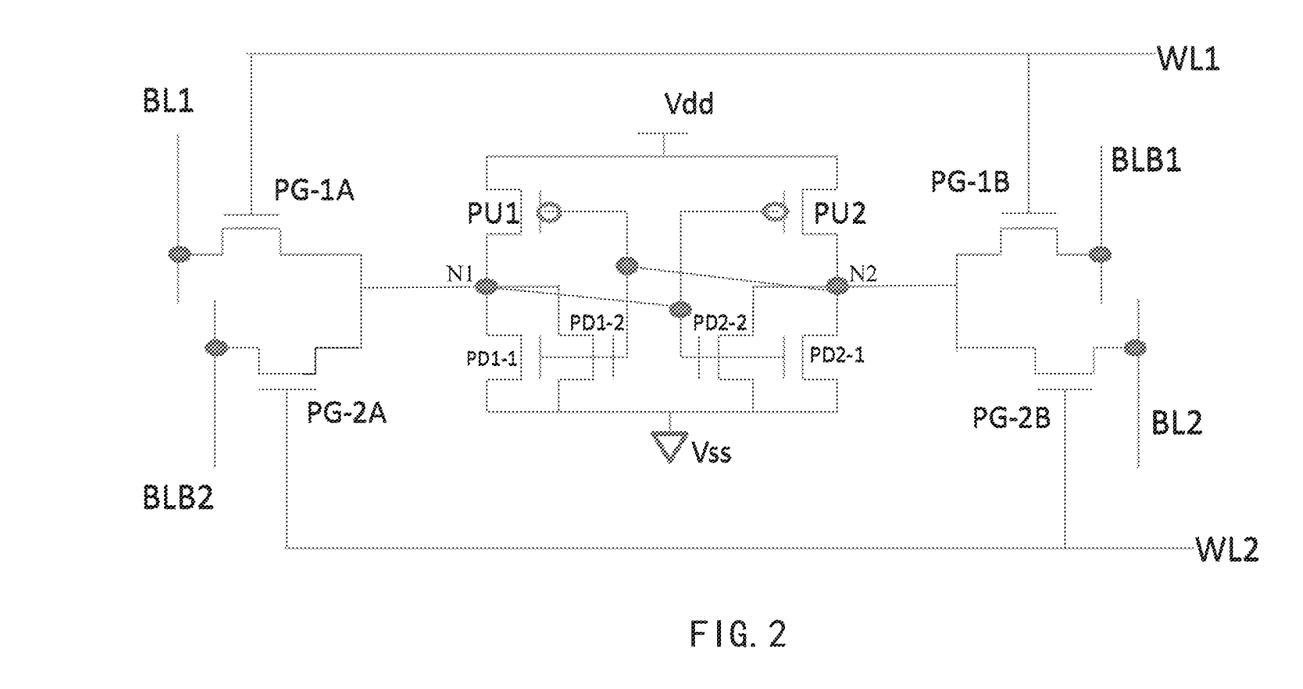
FIG. 2 is a schematic diagram showing the circuit structure of a double-port SRAM cell provided by the present disclosure.

Please refer to FIG. 2 and FIG. 4 together, in the dual-port SRAM cell, sources of the first set of pass gates transistors PG-1A and PG-2A, drain of the first pull-up transistor PU1, drain of the first pull-down sub-transistors PD1-1, and drain of the first pull-down sub-transistors PD1-2 constitute a first node of the dual-port SRAM cell. Correspondingly, sources of the second set of pass gates transistors PG-1B and PG-2B, drain of the second pull-up transistor PU2, drain of the second pull-down sub-transistors PD2-1, and drain of the second pull-down sub-transistors PD2-2 constitute a second node of the dual-port SRAM cell. Thus, in the conventional process, generally, the first node and the second node are lead out by forming a node connector in the metal layer M1. For the reason of the layout design, it can be seen from FIG. 4 that the first gate connector 110 and the second gate connector 120 extend along the X direction, and the node connector extending along the Y direction vertical to the X direction in order to lead out the first node and the second node. Since the first gate connector 110 and the second gate connector 120 have been formed in the rear metal layer M1, in order to avoid short circuit, the node connector in the rear metal layer M1 needs to be disconnected to allow for the first gate connector 110 and the second gate connector 120 being located.

Although the first node connector and the second node connector cannot be formed intactly in the rear metal layer M1 to lead out the first node and the second node, in order to improve manufacturing process efficiency and reduce manufacturing difficulty, a first drain connector 210 may first be formed in the rear metal layer M1 to connect the drain of the first pull-up transistor PU1, the drain of the first pull-down sub-transistors PD1-1 and the drain of the first pull-down sub-transistors PD1-2. Correspondingly, a second drain connector 220 may first be formed to connect the drain of the second pull-up transistor PU2, the drain of the second pull-down sub-transistors PD2-1 and the drain of the second pull-down sub-transistors PD2-2. Further, a first source extractor 310 that lead out the sources of the first set of pass gate transistors PG-1A and PG-2A, and a second source extractor 320 that lead out the sources of the second set of pass gate transistors PG-1B and PG-2B may be formed.

Further, the first drain connector 210 includes contacts (CT, a rectangular frame located on the active area in the figure) that lead out the drain of the first pull-down transistor located in the first pull-down transistor active area AA-02 and the drain of the first pull-up transistor located in the first pull-up transistor active area AA-03, and metal line (the thin line rectangle in the figure) extending along the Y direction to connect the above contacts. Correspondingly, the second drain connector 220 includes contacts (CT, a rectangular frame located on the active area in the figure) that lead out the drain of the second pull-down transistor located in the second pull-down transistor active area AA-05 and the drain of the second pull-up transistor located in the second pull-up transistor active area AA-04, and metal line (the thin line rectangle in the figure) extending along the Y direction to connect the above contacts. The first source extractor 310 includes contacts (CT, a rectangular frame located on the active area in the figure) that lead out sources of the first set of pass gates transistors PG-1A and PG-2A located in the first gate active area AA-01, and metal line (the thin line rectangle in the figure) connecting the above contacts. Correspondingly, the second source extractor 320 includes contacts (CT, a rectangular frame located on the active area in the figure) that lead out the sources of the second set of pass gates transistors PG-1B and PG-2B located in the second gate active area AA-06, and metal line (the thin line rectangle in the figure) connecting the above contacts.

Those skilled in the art will appreciate that the above-described method of forming contacts and connecting metal lines in the rear metal layer M1 can be achieved by existing or future techniques, and the above techniques are highly compatible with existing processes. It does not increase the manufacturing process cost.

Further, in order to solve the above problem that the first node and the second node cannot be extracted out due to the formation of the first gate connector 110 and the second gate connector 120 in the rear metal layer M1, the disclosure provides a method of forming a first node connector and a second node connector in a rear metal layer M2 above the rear metal layer M1, to realize the extraction of the first node and the second node, and realizing the connection between the gate of PD1-1 and the gate of PD1-2, and the connection between the gate of PD2-1 and the gate of PD2-2.

Figure 5:
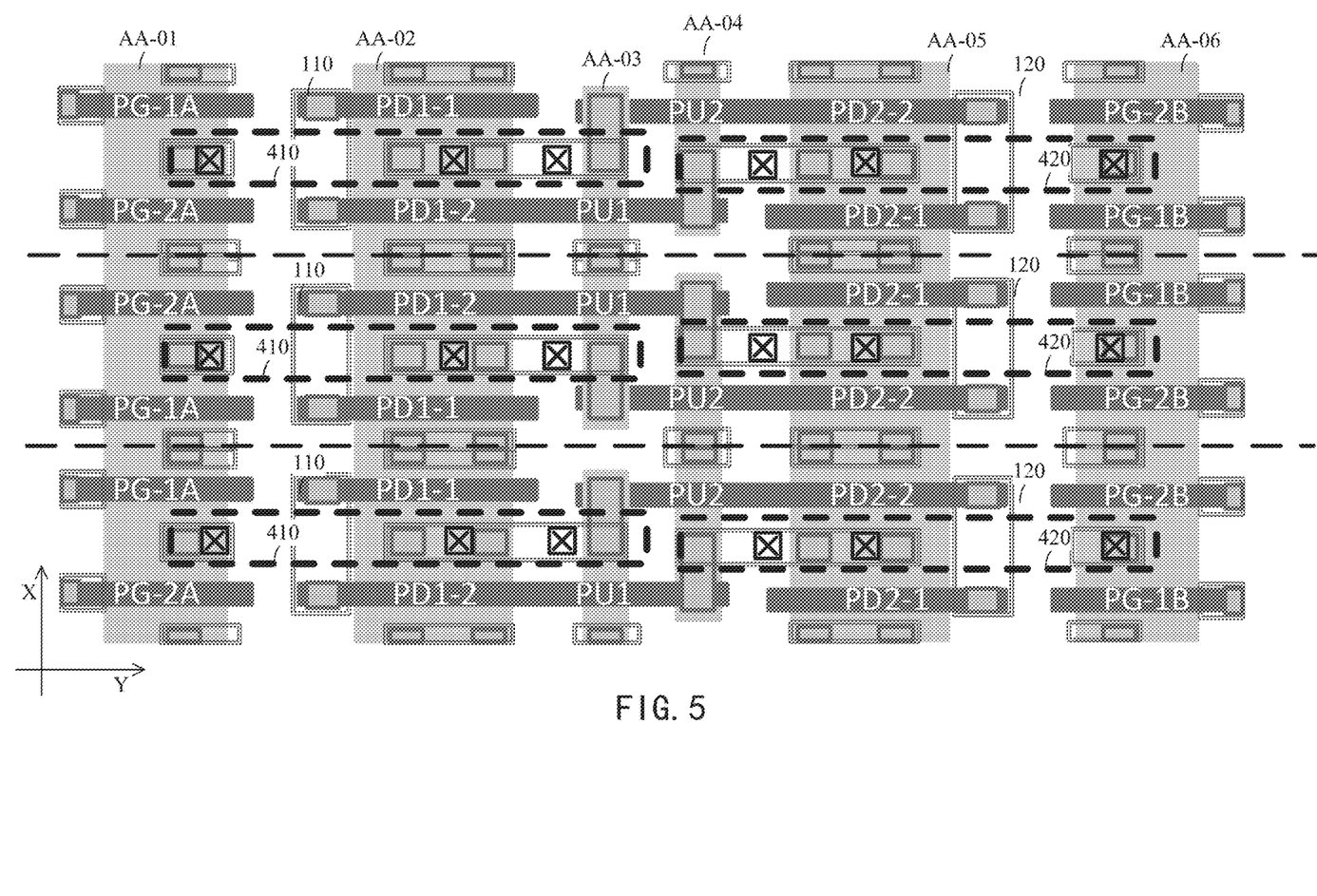
FIG. 5 shows a schematic diagram of the embodiment shown in FIG. 4 plus a second connection layer.

Please understand the above-mentioned rear metal layer M2 with reference to FIG. 5. FIG. 5 shows a schematic view of forming a rear metal layer M2 on the layout shown in FIG. 4, and the first node connector 410 and the second node connector 420 are formed in the rear metal layer M2.

In the above embodiment, the first node connector 410 formed in the rear metal layer M2 includes a contact VIA leading out the first source extractor (the cross rectangle between the gates of PG-1A and PG-2A in the figure), a contact VIA leading out the first drain connector (the cross rectangle between the gates of PD1-1 and PD1-2 in the figure), and the metal line (dashed rectangle in the figure) extending along the Y direction to connect the above contact VIAs. Correspondingly, the second node connector 420 formed in the rear metal layer M2 includes a contact VIA leading out the second source extractor (the cross rectangle between the gates of PG-1B and PG-2B in the figure), a contact VIA leading out the second drain connector (the cross rectangle between the gates of PD2-1 and PD2-2 in the figure), and the metal line (dashed rectangle in the figure) extending along the Y direction to connect the above contact VIAs.

It should be understood by those skilled in the art that the method of forming contact VIAs and connecting metal lines in the rear metal layer M2 can be realized by existing or future techniques, and the above technology has high compatibility with existing processes. It does not increase the manufacturing process cost.

Further, as can be seen from the circuit structure diagram shown in FIG. 2, the first node is also connecting the gates of the second pull-up transistor and the plurality of second pull-down sub-transistors, and the second node is also connecting the gates of the first pull-up transistor and the plurality of first pull-down sub-transistors. As can be seen from the layout design shown in FIG. 4 and FIG. 5, regarding the first node, the gate of the second pull-up transistor PU2 extends to the first pull-up transistor PU1 and is connected to the first node connector by the contact, and the gate of the second pull-up transistor PU2 also extends to the gate of second pull-down sub-transistors PD2-2, and further connects to the gate of second pull-down sub-transistors PD2-1 by the second gate connector. Correspondingly, regarding the second node, the gate of the first pull-up transistor PU1 extends to the second pull-up transistor PU2 and is connected to the second node connector by the contact, and the gate of the first pull-up transistor PU1 also extends to the gate of first pull-down sub-transistors PD1-2, and further connects to the gate of first pull-down sub-transistors PD1-1 by the first gate connector.

As can be seen from the layout of the layout shown in FIGS. 4 and 5, the dual-port SRAM cell provided by the present disclosure has a central symmetrical pattern, and therefore, the device has excellent symmetry and effectively improves device performance.

So far, a dual-port SRAM cell provided according to an embodiment of the present has been described, and in this embodiment, the connectors connecting the gates of the plurality of first pull-down sub-transistors and the gates of the plurality of second pull-down sub-transistors are located on the rear metal layer M1 at a different plane from the gate layer where the gates are located. Further, the connectors connecting the first node and the connector connecting the second node are located on the rear metal layer M2, and the rear metal layer M2 is located above the rear metal layer M1. Through the above dual-port SRAM cell design, the electrical matching of the device can be effectively improved, the process window is increased, and the process is compatible with the conventional process without increasing the cost.

Figure 6:
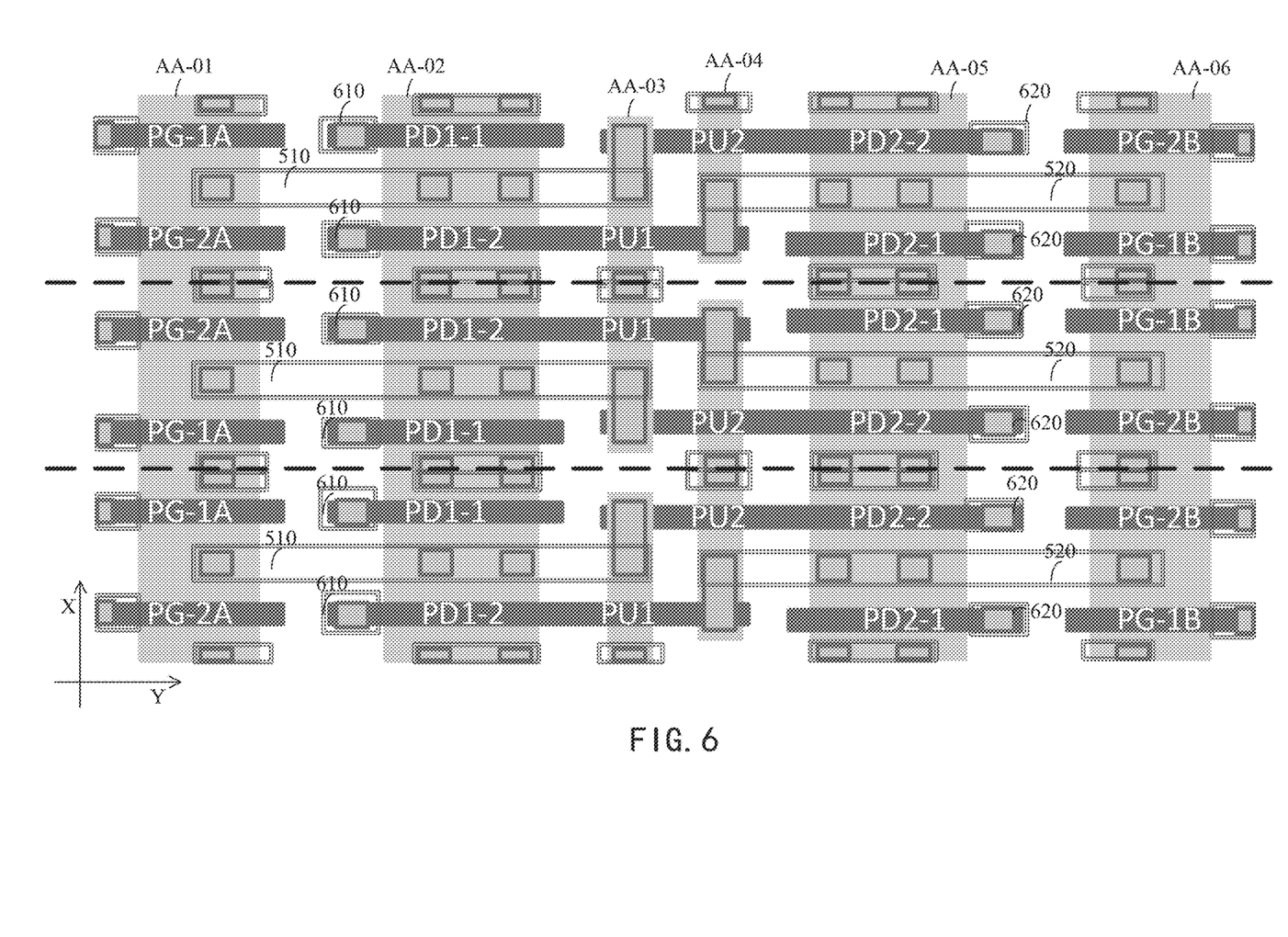
FIG. 6 shows an alternative schematic diagram of embodiment of a dual-port SRAM cell layout provided by the present disclosure.
Figure 7:
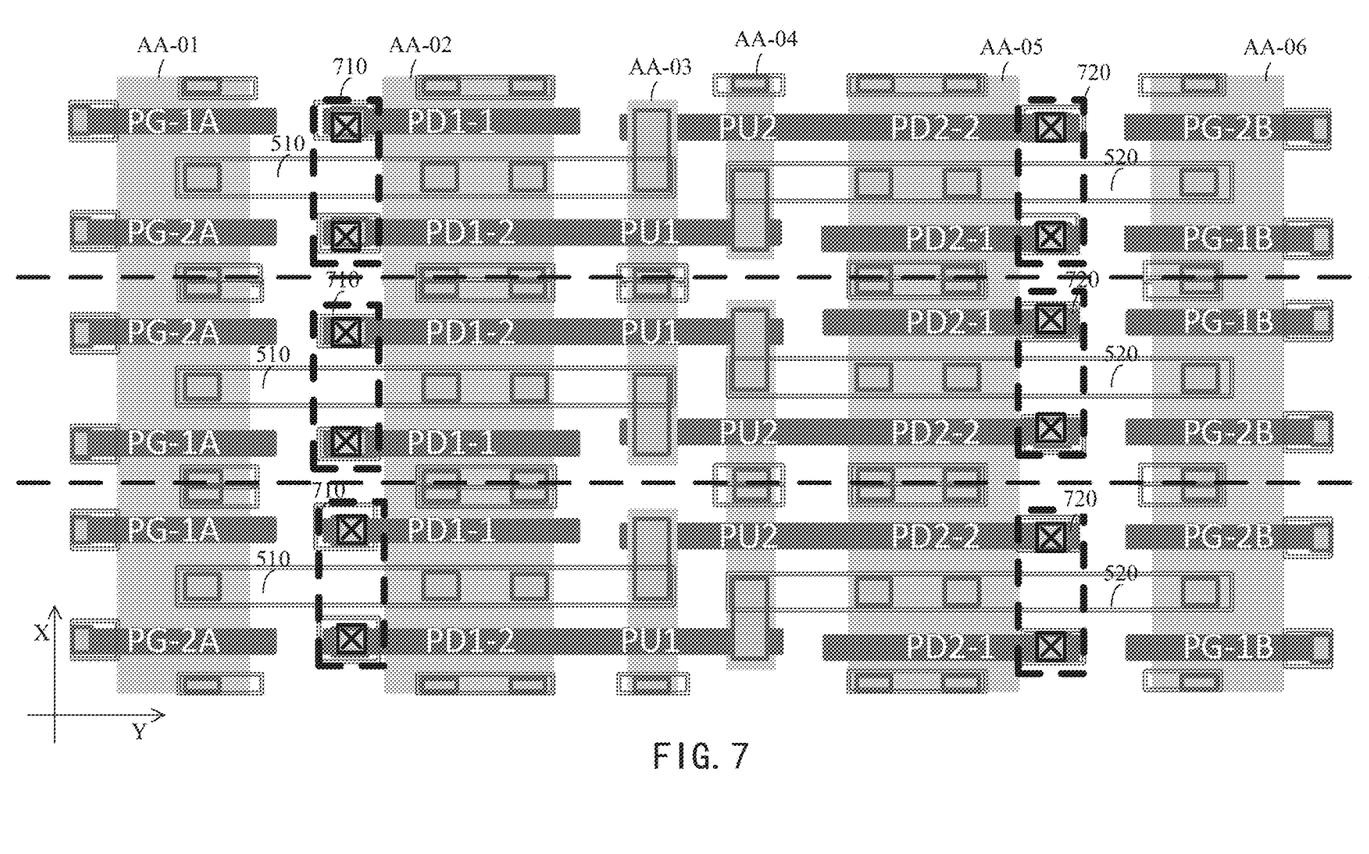
FIG. 7 shows a schematic diagram of the embodiment shown in FIG. 6 plus a first connection layer.

The present disclosure further provides another embodiment of a dual-port SRAM cell; please refer to FIGS. 6 and 7.

The substrate (including active area formed in the substrate), a plurality of transistors and the gates of the transistors on the substrate of the dual-port SRAM cell shown in FIGS. 6 and 7 are arranged the same as shown in FIGS. 5 and 4, not described herein again.

Different to the embodiment shown in FIG. 4 and FIG. 5, in FIG. 6 and FIG. 7, a first node connector 510 and a second node connector 520 are formed in the rear metal layer M1.

As shown in FIG. 6, the first node connector 510 includes contacts (CT, the rectangular frame in the active area in the figure) leading out the drain of the first pull-down transistor located in the first pull-down transistor active area AA-02 and the drain of the first pull-up transistor located in the first pull-up transistor active area AA-03, and the contacts (CT, the rectangular frame in the active area in the figure) leading out the sources of the first set of the pass gate transistors PG-1A and PG-2A located in the first gate transistor active area AA-01, and the metal line (the thin-line rectangular frame in the figure) extending along the Y direction and connecting the above contacts. Correspondingly, the second node connector 520 includes contacts (CT, the rectangular frame in the active area in the figure) leading out the drain of the second pull-down transistor located in the second pull-down transistor active area AA-05, the drain of the second pull-up transistor located in the second pull-up transistor active area AA-04 and the contacts (CT, the rectangular frame in the active area in the figure) leading out the sources of the second set of the pass gate transistors PG-1B and PG-2B located in the second gate transistor active area AA-06, and the metal line (the thin-line rectangular frame in the figure) extending along the Y direction and connecting the above contacts.

Those skilled in the art will appreciate that the method of forming contacts and connecting metal lines in the rear metal layer M1 can be achieved by existing or future techniques, and the above techniques are highly compatible with existing processes. It does not increase the manufacturing process cost.

As described above, since the gate connector and the node connector respectively extend in two mutually perpendicular directions, the above-mentioned gate connector and node connector cannot be formed in the same layer. Therefore, in this embodiment, the gate connector is formed in the rear metal layer M2 above the rear metal layer M1.

Although a complete first gate connector cannot be formed in the rear metal layer M1 to connect the gates of the first pull-down sub-transistors PD1-1 and the first pull-down sub-transistors PD1-2, and a complete second gate connector cannot be formed to connect the gates of the second pull-down sub-transistors PD2-1 and the second pull-down sub-transistors PD2-2, contacts and metal lines (shown as extractor 610 in FIG. 6) leading out the gates of the first pull-down sub-transistors PD1-1 and the first pull-down sub-transistors PD1-2 may first be formed in the rear metal layer M1 to improve manufacturing process efficiency and reduce manufacturing difficulty. Correspondingly, contacts and metal lines (shown as extractor 620 in FIG. 6) leading out the gates of the second pull-down sub-transistors PD2-1 and the second pull-down sub-transistors PD2-2 may first be formed in the rear metal layer M1.

Those skilled in the art will appreciate that the method of forming contacts and connecting metal lines in the rear metal layer M1 can be achieved by existing or future techniques, and the above techniques are highly compatible with existing processes. It does not increase the manufacturing process cost.

Further, in the above embodiment, referring to FIG. 7, a first gate connector 710 and a second gate connector 720 are further formed in the rear metal layer M2 above the rear metal layer M1.

The first gate connector 710 comprises contact VIAs (cross rectangles on the gates of PD1-1, PD1-2 in the figure) that lead out the extractors 610, and the metal line (the dotted rectangle in the figure) extending along the X direction and connecting to the contact VIA. Correspondingly, the second gate connector 720 comprises contact VIAs (cross rectangles on the gates of PD2-1, PD2-2 in the figure) that lead out the extractors 620, and the metal line (the dotted rectangle in the figure) extending along the X direction and connecting to the contact VIA.

It should be understood by those skilled in the art that the above method of forming contact holes and connecting metal lines in the rear metal layer M2 can be realized by existing or future techniques, and the above technology has high compatibility with existing processes. It does not increase the manufacturing process cost.

As can be seen from the circuit structure shown in FIG. 2, the first node is also connecting to the gates of the second pull-up transistor and a plurality of second pull-down sub-transistors, and the second node is also connecting to the gates of the first pull-up transistor and a plurality of first pull-down sub-transistors. As can be seen from the layout design diagrams shown in FIG. 6 and FIG. 7, regarding the first node, the gate of the second pull-up transistor PU2 extends to the first pull-up transistor PU1, and is connecting to the first node connector by the contact, and the gate of the second pull-up transistor PU2 also extends to the gate of second pull-down sub-transistors PD2-2, and further connects to the gate of the second pull-down sub-transistors PD2-1 by the second gate connector. Correspondingly, regarding the second node, the gate of the first pull-up transistor PU1 extends to the second pull-up transistor PU2, and is connecting to the second node connector by the contact, and the gate of the first pull-up transistor PU1 also extends to the first pull-down sub-transistors PD1-2, and further connects to the first pull-down sub-transistors PD1-1 by the first gate connector.

From the layout shown in FIG. 6 and FIG. 7, it can be seen that the dual-port SRAM unit provided by the disclosure has a central symmetrical pattern, therefore, the device has excellent symmetry to improve device performance.

So far, the dual-port SRAM cell provided according to another embodiment of the present disclosure has been described. In this embodiment, connectors connecting gates of the plurality of first pull-down sub-transistors and connecting gates of the plurality of second pull-down sub-transistors are located on the rear metal layer M2 that is located at a different plane from the gate layer where the gates are located. Further, the connector connecting the first node and the connector connecting the second node are located in the rear metal layer M1, and the rear metal layer M2 is located above the rear metal layer M1. According to the above dual-port SRAM cell design, the electrical matching of the device can be effectively improved, the process window is increased, and the process is compatible with the conventional process without increasing the cost.

Figure 8:
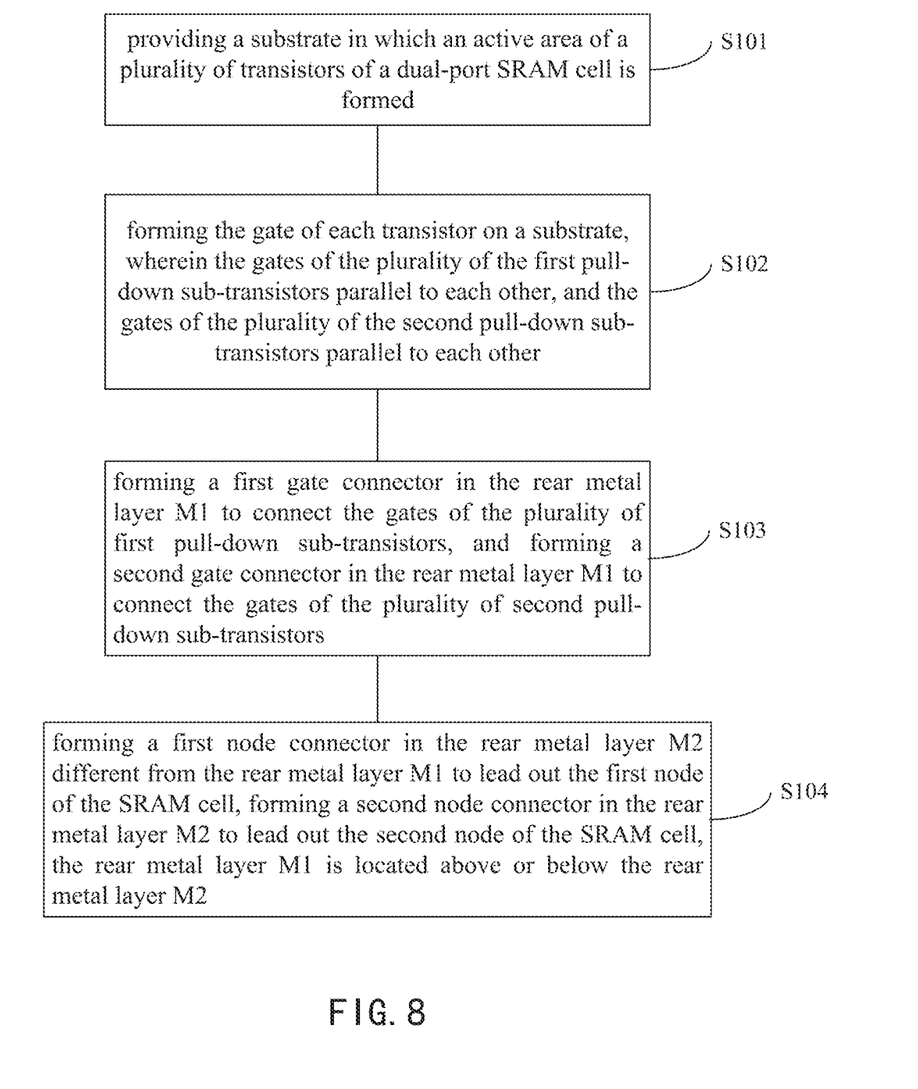
FIG. 8 is a flow chart showing the manufacturing method provided by the present disclosure.

The present disclosure also provides a method of fabricating the above semiconductor structure, and FIG. 8 is a flow chart showing the manufacturing method provided by the present disclosure. As shown in FIG. 8, the above manufacturing method may include:

step S101: providing a substrate in which an active area of a plurality of transistors of a dual-port SRAM cell is formed;

step S102: forming the gate of each transistor on the substrate, and the gates of the plurality of the first pull-down sub-transistors parallel to each other, and the gates of the plurality of the second pull-down sub-transistors parallel to each other;

step S103: forming, in a rear metal layer M1, a first gate connector to connect the gates of the plurality of first pull-down sub-transistors, and a second gate connector to connect the gates of the plurality of second pull-down sub-transistors;

step S104: forming, in a rear metal layer M2, a first node connector different from the rear metal layer M1 to lead out the first node of the SRAM cell, and a second node connector to lead out the second node of the SRAM cell, the rear metal layer M1 is located above or below the rear metal layer M2.

In the dual-port SRAM cell fabricated by the manufacturing method provided by the present disclosure, connectors connecting the gates of the plurality of first pull-down sub-transistors and the gates of the plurality of second pull-down sub-transistors are located in the rear metal layer M1 that is located on a different plane from the gate layer where the gates are located. Further, the connector connecting the first node and the connector connecting the second node are located in the rear metal layer M2, and the rear metal layer M1 is located above or below the rear metal layer M2. According to the above dual-port SRAM cell design, the electrical matching of the device can be effectively improved, the process window is increased, and the process is compatible with the conventional process without increasing the cost.

Although the present disclosure has been described with respect to certain exemplary embodiments, it will be apparent that various modifications and changes may be made to these embodiments without departing from the more general spirit and scope of the disclosure. Accordingly, the specification and the accompanying drawings are to be regarded in an illustrative rather than a restrictive sense.

It is to be understood that this description is not intended to explain or limit the scope or meaning of the claims. In addition, in the detailed description above, it can be seen that various features are combined together in a single embodiment for the purpose of simplifying the disclosure. The method of the present disclosure should not be interpreted as reflecting the intention that the claimed embodiments require more features than those expressly listed in each claim. Rather, as reflected by the appended claims, an inventive subject matter lies in being less than all features of a single disclosed embodiment. Therefore, the appended claims are hereby incorporated into the detailed description, with each claim standing on its own as a separate embodiment.

One embodiment or embodiments mentioned in this description is/are intended to be, combined with a particular feature, structure, or characteristic described in the embodiment, included in at least one embodiment of a circuit or method. The appearances of phrases in various places in the specification are not necessarily all referring to a same embodiment.

What is claimed is:

1. A semiconductor structure of a dual port static random access memory cell, the dual port static random access memory cell comprising:
    a plurality of transistors, the plurality of transistors comprising a first pull-down transistor and a second pull-down transistor, wherein,
    the first pull-down transistor comprises a plurality of first pull-down sub-transistors connected in parallel, the plurality of first pull-down sub-transistors sharing a first pull-down transistor active area extending in a first direction, the second pull-down transistor comprises a plurality of second pull-down sub-transistors connected in parallel, the plurality of second pull-down sub-transistors sharing a second pull-down transistor active area extending in the first direction;
    the plurality of gates of the plurality of first pull-down sub-transistors are parallel to each other and extend in a second direction, and the plurality of gates of the plurality of second pull-down sub-transistors are parallel to each other and extend in the second direction, the second direction being perpendicular to the first direction;
    the semiconductor structure further comprises a first gate connector and a second gate connector, the first gate connector shorting the plurality of gates of the plurality of first pull-down sub-transistors, the second gate connector shorting the plurality of gates of the plurality of second pull-down sub-transistors; and
    a first connection layer where the first gate connector and the second gate connector are located and a gate layer where the plurality of gates of the plurality of first pull-down sub-transistors and the plurality of gates of the plurality of second pull-down sub-transistors are located are located on different planes.

2. The semiconductor structure of claim 1 wherein the first connection layer is above the gate layer;
    the first gate connector comprises a first gate metal line, the plurality of gates of the plurality of first pull-down sub-transistors and the first gate metal line are connected by a plurality of first gate contactors extending along a height of the semiconductor structure; and
    the second gate connector comprises a second gate metal line, the plurality of gates of the plurality of second pull-down sub-transistors and the second gate metal line are connected by a plurality of second gate contactors extending along the height of the semiconductor structure.

3. The semiconductor structure of claim 1 wherein the plurality of transistors further comprises a first pull-up transistor, a second pull-up transistor, a first set of pass-gate transistor, and a second set of pass-gate transistor, wherein
    the first pull-up transistor comprises a first pull-up transistor active area and a first pull-up transistor gate, and the second pull-up transistor comprises a second pull-up transistor active area and a second pull-up transistor gate, the first pull-up transistor active area and the second pull-up transistor active area are parallel to each other and extend along the first direction;
    the first set of pass-gate transistor comprises a first port gate transistor and a second port gate transistor, the first port gate transistor and the second port gate transistor share a first gate transistor active area extending along the first direction;
    the second set of pass-gate transistor comprises a third port gate transistor and a fourth port gate transistor, the third port gate transistor and the fourth port gate transistor share a second gate transistor active area extending along the first direction;
    the semiconductor structure further comprises a first node connector and a second node connector, wherein the first node connector shorts sources of the first set of pass-gate transistor located in the first gate transistor active area, a drain of the first pull-up transistor located in the first pull-up transistor active area and a plurality of drains of the plurality of first pull-down sub-transistors located in the first pull-down transistor active area; the second node connector shorts sources of the second set of pass-gate transistor located in the second gate transistor active area, a drain of the second pull-up transistor located in the second pull-up transistor active area and a plurality of drains of the plurality of second pull-down sub-transistors located in the second pull-down transistor active area; and the first node connector and the second node connector are located at a second connection layer, and the first connection layer and the second connection layer are located on different planes.

4. The semiconductor structure of claim 3 wherein the first gate connector comprises a first gate metal line extending along the first direction, the second gate connector comprises a second gate metal line extending along the second direction; and the first node connector comprises a first node metal line extending along the second direction, and the second node connector comprises a second node metal line extending along the second direction.

5. The semiconductor structure of claim 4 wherein the first connection layer locates between the gate layer and the second connection layer;

the first gate metal line is connected to the plurality of gates of the plurality of first pull-down sub-transistors through a plurality of first gate contacts, the second gate metal line is connected to the plurality of gates of the plurality of second pull-down sub-transistors through a plurality of second gate contacts; and the first node metal line and the sources of the first set of pass-gate transistor, the drain of the first pull-up transistor and the plurality of drains of the plurality of first pull-down sub-transistors are connected by a plurality of first node contactors passing through the first connection layer, the second node metal line and the sources of the second set of pass-gate transistor, the drain of the second pull-up transistor and the plurality of drains of the plurality of second pull-down sub-transistors are connected by a plurality of second node contactors passing through the first connection layer.

6. The semiconductor structure of claim 5 wherein the plurality of first node contactors further comprise a plurality of first drain contacts located in the first connection layer, first source contacts, and a first drain metal line connecting the plurality of first drain contacts, the plurality of second node contactors further comprise a plurality of second drain contacts, second source contacts, and a second drain metal line connecting the plurality of second drain contacts, wherein the plurality of first drain contacts lead out the plurality of drains of the plurality of first pull-down sub-transistors and the drain of the first pull-up transistor, the first source contacts lead out the sources of the first set of pass-gate transistor, the plurality of second drain contacts lead out the plurality of drains of the plurality of second pull-down sub-transistors and the drain of the second pull-up transistor, the second source contacts lead out the sources of the second set of pass-gate transistor; and the plurality of first node contactors further comprise first node vias, the plurality of second node contactors further comprise second node vias, wherein the first node metal line is connected to the first drain metal line and the first source contacts through the first node vias, the second node metal line is connected to the second drain metal line and the second source contacts through the second node vias.

7. The semiconductor structure of claim 4 wherein the second connection layer locates between the gate layer and the first connection layer;

the first node metal line is connected to the sources of the first set of pass-gate transistor, the drain of the first pull-up transistor and the plurality of drains of the plurality of first pull-down sub-transistors by a plurality of first node contacts, the second node metal line is connected to the sources of the second set of pass-gate transistor, the drain of the second pull-up transistor and the plurality of drains of the plurality of second pull-down sub-transistors by a plurality of second node contacts; and the first gate metal line is connected to the plurality of gates of the plurality of first pull-down sub-transistors by a plurality of first gate contactors passing through the second connection layer, the second gate metal line is connected to the plurality of gates of the plurality of second pull-down sub-transistors by a plurality of second gate contactors passing through the second connection layer.

8. The semiconductor structure of claim 7 wherein the plurality of first gate contactors further comprises a first contact portion in the second connection layer and a first via portion connecting the first contact portion and the first gate metal line, the plurality of second gate contactors further comprises a second contact portion in the second connection layer and a second via portion connecting the second contact portion and the second gate metal line.

9. The semiconductor structure of claim 3 wherein the gate of the first pull-up transistor extends from one of the plurality of gates of the plurality of first pull-down sub-transistors and extends to the drain of the second pull-up transistor, and electrically connected to the second node connector by the drain of the second pull-up transistor; and the gate of the second pull-up transistor extends from one of the plurality of gates of the plurality of second pull-down sub-transistors and extends to the drain of the first pull-up transistor, and electrically connected to the first node connector by the drain of the first pull-up transistor.

10. The semiconductor structure according to claim 1, wherein the layout of the dual port static random access memory cell is a central symmetrical pattern in the height direction of the semiconductor structure.

11. A manufacturing method of semiconductor structure, the semiconductor structure being a dual port static random access memory cell, the dual port static random access memory cell comprising:

a plurality of transistors, the plurality of transistors comprising a first pull-down transistor and a second pull-down transistor, the first pull-down transistor comprises a plurality of first pull-down sub-transistors connected in parallel, and the second pull-down transistor comprises a plurality of second pull-down sub-transistors connected in parallel, the manufacturing method comprises:

providing a substrate in which an active area of the plurality of transistors extending in a first direction is formed, wherein the plurality of first pull-down sub-transistors share a first pull-down transistor active area, the plurality of second pull-down sub-transistors share a second pull-down transistor active area;

forming gates of the plurality of transistors extending in a second direction over the active area of the plurality of transistors, the second direction being perpendicular to the first direction, wherein a plurality of gates of the plurality of first pull-down sub-transistors are parallel and electrically isolated from each other, a plurality of gates of the plurality of second pull-down sub-transistors are parallel and electrically isolated from each other; and forming a first gate connector shorting the plurality of gates of the plurality of first pull-down sub-transistors in a first connection layer above the plurality of gates of the plurality of first pull-down sub-transistors, forming a second gate connector shorting the plurality of gates of the plurality of second pull-down sub-transistors in the first connection layer.

12. The manufacturing method of claim 11, wherein forming the first gate connection and the second gate connection further comprises:

forming a plurality of first gate contacts over the plurality of gates of the plurality of first pull-down sub-transistors, forming a plurality of second gate contacts over the plurality of gates of the plurality of second pull-down sub-transistors; and forming a first gate metal line connecting the plurality of first gate contacts over the plurality of first gate contacts, forming a second gate metal line connecting the plurality of second gate contacts over the plurality of second gate contacts.

13. The manufacturing method of claim 11, wherein the plurality of transistors further comprises a first pull-up transistor, a second pull-up transistor, a first set of pass-gate transistor, and a second set of pass-gate transistor, wherein the first pull-up transistor comprises a first pull-up transistor active area and a first pull-up transistor gate, and the second pull-up transistor comprises a second pull-up transistor active area and a second pull-up transistor gate, the first pull-up transistor active area and the second pull-up transistor active area are parallel to each other and extend along the first direction;

the first set of pass-gate transistor comprises a first port gate transistor and a second port gate transistor, the first port gate transistor and the second port gate transistor share a first gate transistor active area extending along the first direction;

the second set of pass-gate transistor comprises a third port gate transistor and a fourth port gate transistor, the third port gate transistor and the fourth port gate transistor share a second gate transistor active area extending along the first direction;

the manufacturing method further comprises forming a first node connector and a second node connector in a second connection layer, wherein the first connection layer and the second connection layer are located on different planes; and the first node connector shorts sources of the first set of pass-gate transistor located in the first gate transistor active area, a drain of the first pull-up transistor located in the first pull-up transistor active area and a plurality of drains of the plurality of first pull-down sub-transistors located in the first pull-down transistor active area; the second node connector shorts sources of the second set of pass-gate transistor located in the second gate transistor active area, a drain of the second pull-up transistor located in the second pull-up transistor active area and a plurality of drains of the plurality of second pull-down sub-transistors located in the second pull-down transistor active area.

14. The manufacturing method of claim 13, wherein the forming the first gate connector further comprises forming a first gate metal line extending along the first direction, forming the second gate connector further comprises forming a second gate metal line extending along the second direction; and forming the first node connector further comprises forming a first node metal line extending along the second direction, forming the second node connector further comprises forming a second node metal line extending along the second direction.

15. The manufacturing method of claim 14, wherein the first connection layer is formed between the gate layer and the second connection layer;

the manufacturing method further comprises forming a plurality of first gate contacts and a plurality of second gate contacts, wherein the first gate metal line is connected to the plurality of gates of the plurality of first pull-down sub-transistors by the plurality of first gate contacts, the second gate metal line is connected to the plurality of gates of the plurality of second pull-down sub-transistors by the plurality of second gate contacts; and the manufacturing method further comprises forming a plurality of first node contactors and a plurality of second node contactors passing through the first connection layer, wherein the first node metal line and the sources of the first set of pass-gate transistor, the drain of the first pull-up transistor and the plurality of drains of the plurality of first pull-down sub-transistors are connected by the plurality of first node contactors, the second node metal line and the sources of the second set of pass-gate transistor, the drain of the second pull-up transistor and the plurality of drains of the plurality of second pull-down sub-transistors are connected by the plurality of second node contactors.

16. The manufacturing method of claim 15, wherein the forming the plurality of first node contactors further comprises: forming a plurality of first drain contacts, first source contacts, and a first drain metal line connecting the plurality of first drain contacts in the first connection layer;

forming the plurality of second node contactors further comprises: forming a plurality of second drain contacts, second source contacts, and a second drain metal line connecting the plurality of second drain contacts in the second connection layer, wherein the plurality of first drain contacts lead out the plurality of drains of the plurality of first pull-down sub-transistors and the drain of the first pull-up transistor, the first source contacts lead out the sources of the first set of pass-gate transistor, the plurality of second drain contacts lead out the plurality of drains of the plurality of second pull-down sub-transistors and the drain of the second pull-up transistor, the second source contacts lead out the sources of the second set of pass-gate transistor; and forming the plurality of first node contactors further comprises: forming first node vias, forming the plurality of second node contactors further comprises: forming second node vias, wherein the first node metal line is connected to the first drain metal line and the first source contacts through the first node vias, the second node metal line is connected to the second drain metal line and the second source contacts through the second node vias.

17. The manufacturing method of claim 14, wherein the second connection layer is formed between the gate layer and the first connection layer;

the manufacturing method further comprises forming a plurality of first node contacts and a plurality of second node contacts, wherein the first node metal line is connected to the sources of the first set of pass-gate transistor, the drain of the first pull-up transistor and the plurality of drains of the plurality of first pull-down sub-transistors by the plurality of first node contacts, the second node metal line is connected to the sources of the second set of pass-gate transistor, the drain of the second pull-up transistor and the plurality of drains of the plurality of second pull-down sub-transistors by the plurality of second node contacts; and the manufacturing method further comprises forming a plurality of first gate contactors and a plurality of second gate contactors passing through the second connection layer, wherein the first gate metal line is connected to the plurality of gates of the plurality of first pull-down sub-transistors by the plurality of first gate contactors, the second gate metal line is connected to the plurality of gates of the plurality of second pull-down sub-transistors by the plurality of second gate contactors.

18. The method of manufacturing of claim 17, wherein forming the plurality of first gate contactors further comprises: forming a first contact portion in the second connection layer and forming a first via portion connecting the first contact portion and the first gate metal line; and forming the plurality of second gate contactors further comprises: forming a second contact portion in the second connection layer and forming a second via portion connecting the second contact portion and the second gate metal line.

19. The manufacturing method of claim 13, wherein the forming the gates of the plurality of transistors extending along the second direction further comprises: forming the gate of the first pull-up transistor which extends from one of the plurality of gates of the plurality of first pull-down sub-transistors and extends to the drain of the second pull-up transistor, the gate of the first pull-up transistor being electrically connected to the second node connector by drain of the second pull-up transistor; and forming the gate of the second pull-up transistor which extends from one of the plurality of gates of the plurality of second pull-down sub-transistors and extends to the drain of the first pull-up transistor, the gate of the second pull-up transistor being electrically connected to the first node connector by drain of the first pull-up transistor.

20. The manufacturing method according to claim 11, wherein the layout of the formed dual port static random access memory cell is a central symmetrical pattern in the height direction of the semiconductor structure.

* * * * *